United States Patent
Chang et al.

(10) Patent No.: US 8,878,356 B2
(45) Date of Patent: *Nov. 4, 2014

(54) PACKAGE STRUCTURE HAVING MICRO-ELECTRO-MECHANICAL SYSTEM ELEMENT AND METHOD OF FABRICATION THE SAME

(71) Applicant: Siliconware Precision Industries Co., Ltd., Taichung Hsien (TW)

(72) Inventors: Hong-Da Chang, Taichung Hsien (TW); Cheng-Hsiang Liu, Taichung Hsien (TW); Kuang-Wei Huang, Taichung Hsien (TW); Chun-Hung Lin, Taichung Hsien (TW); Hsin-Yi Liao, Taichung Hsien (TW)

(73) Assignee: Siliconware Precision Industries Co., Ltd., Taichung (TW)

(*) Notice: Subject to any disclaimer, the term of this patent is extended or adjusted under 35 U.S.C. 154(b) by 9 days.

This patent is subject to a terminal disclaimer.

(21) Appl. No.: 13/660,200

(22) Filed: Oct. 25, 2012

(65) Prior Publication Data
US 2013/0341739 A1  Dec. 26, 2013

(30) Foreign Application Priority Data
Jun. 22, 2012  (TW) .............................. 101122366 A

(51) Int. Cl.
| | |
|---|---|
| H01L 23/48 | (2006.01) |
| H01L 23/22 | (2006.01) |
| H01L 23/24 | (2006.01) |
| H01L 23/051 | (2006.01) |
| H01L 23/053 | (2006.01) |
| H01L 23/043 | (2006.01) |

(52) U.S. Cl.
CPC ............. *H01L 23/051* (2013.01); *H01L 23/053* (2013.01); *H01L 23/043* (2013.01)
USPC ........... 257/693; 257/687; 438/121; 438/124; 438/125; 438/127

(58) Field of Classification Search
CPC .......... H10L 23/45; H10L 23/52; H10L 23/53
USPC .......... 257/687, 693, 417; 438/121, 124, 125, 438/127
See application file for complete search history.

(56) References Cited

U.S. PATENT DOCUMENTS

| | | | |
|---|---|---|---|
| 7,316,965 B2 | 1/2008 | Hooper et al. | |
| 2008/0185699 A1* | 8/2008 | Wang | 257/676 |
| 2009/0085205 A1* | 4/2009 | Sugizaki | 257/737 |
| 2011/0198714 A1* | 8/2011 | Yang | 257/416 |
| 2011/0254111 A1* | 10/2011 | Leclair et al. | 257/416 |

* cited by examiner

*Primary Examiner* — Karen Kusumakar
(74) *Attorney, Agent, or Firm* — Edwards Wildman Palmer LLP; Peter F. Corless; Steven M. Jensen

(57) ABSTRACT

A package structure is provided, including: a substrate having a ground pad and an MEMS element; a lid disposed on the substrate for covering the MEMS element; a wire segment electrically connected to the ground pad; an encapsulant encapsulating the lid and the wire segment; and a circuit layer formed on the encapsulant and electrically connected to the wire segment and the lid so as to commonly ground the substrate and the lid, thereby releasing accumulated electric charges on the lid so as to improve the reliability of the MEMS system and reduce the number of I/O connections.

38 Claims, 4 Drawing Sheets

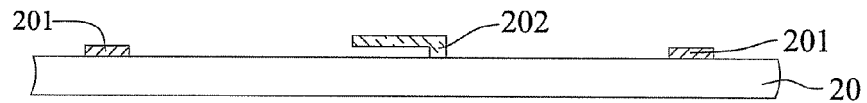
FIG. 2A
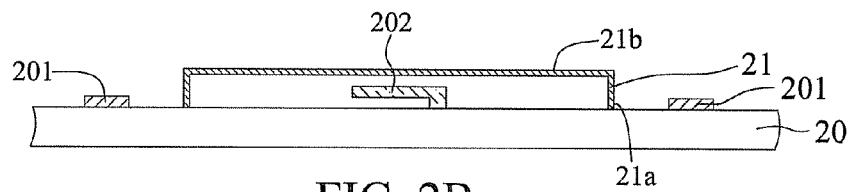
FIG. 2B
FIG. 2B'
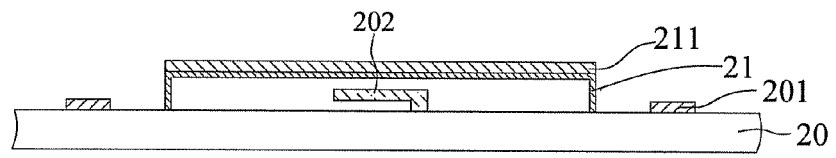
FIG. 2B'
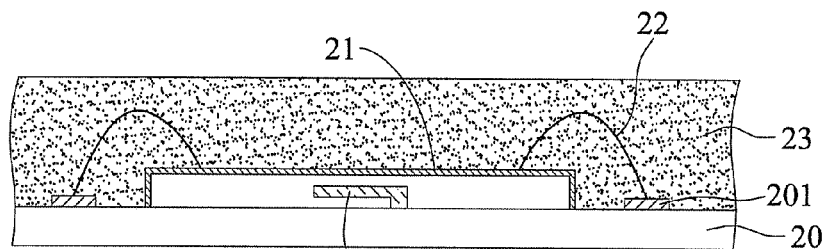
FIG. 2C
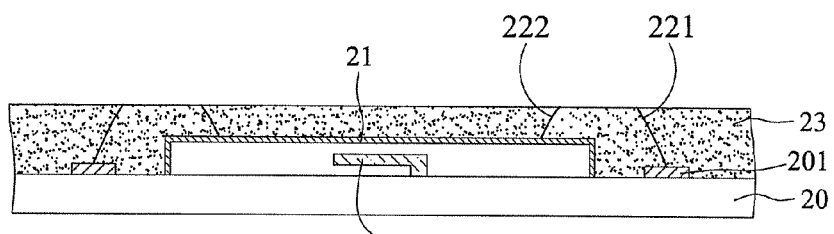
FIG. 2D

PACKAGE STRUCTURE HAVING MICRO-ELECTRO-MECHANICAL SYSTEM ELEMENT AND METHOD OF FABRICATION THE SAME

CROSS-REFERENCES TO RELATED APPLICATIONS

This application claims under 35 U.S.C. §119(a) the benefit of Taiwanese Application No. 101122366, filed Jun. 22, 2012, the entire contents of which is incorporated herein by reference.

BACKGROUND OF THE INVENTION

1. Field of the Invention

The present invention relates to package structures and methods of fabricating the same, and, more particularly, to a package structure having a micro-electro-mechanical system (MEMS) element and a method of fabricating the same.

2. Description of Related Art

MEMS elements have integrated electrical and mechanical functions and can be fabricated through various micro-fabrication technologies. An MEMS element can be disposed on a chip and covered by a lid, and then the overall structure is packaged to obtain an MEMS package structure.

FIG. 1 is a schematic cross-sectional view showing a conventional package structure 1 having an MEMS element 102 as disclosed by U.S. Pat. No. 7,316,965. A chip 10 having a plurality of connection pads 101 and at least an MEMS element 102 is provided. A lid 11 is disposed on the chip 10 to cover the MEMS element 102 and connected to the connection pads 101.

However, since the lid 11 is in contact with the chip 10, when the MEMS element 102 is in operation, electric charges will accumulate on the lid 11, thus adversely affecting signals and reducing the reliability of the MEMS system.

Therefore, there is a need to provide a package structure and a method of fabricating the same so as to overcome the above-described drawbacks.

SUMMARY OF THE INVENTION

Accordingly, the present invention provides a package structure, which comprises: a substrate having at least a ground pad and at least an MEMS element; a lid disposed on the substrate for covering the MEMS element; at least a first wire segment electrically connected to the ground pad; at least a second wire segment electrically connected to the lid; an encapsulant formed on the substrate for encapsulating the lid and the first and second wire segments, with one end of each of the first and second wire segments exposed therefrom; a circuit layer formed on the encapsulant and electrically connected to the first and second wire segments; and at least a ground conductive element electrically connected to the circuit layer so as for the substrate and the lid to be electrically jointly connected to the at least a ground conductive element via the circuit layer.

In an embodiment, the package structure further comprise: at least a dielectric layer formed between the encapsulant and the circuit layer; and a plurality of conductive vias formed in the dielectric layer for electrically connecting the first and second wire segments to the circuit layer.

The present invention provides another package structure, which comprises: a substrate having at least a ground pad and at least an MEMS element; a lid having a first side and a second side opposite to the first side and covering the MEMS element, the lid being disposed on the substrate via the first side; at least a wire segment electrically connected to the ground pad; an encapsulant formed on the substrate for encapsulating the lid and the wire segment, with the second side of the lid and one end of the wire segment exposed therefrom; a circuit layer formed on the encapsulant and electrically connected to the lid and the wire segment; and at least a ground conductive element electrically connected to the circuit layer so as for the substrate and the lid to be electrically connected to the at least a ground conductive element via the circuit layer.

In an embodiment, the package structure further comprise: at least a dielectric layer formed between the encapsulant and the circuit layer; and a plurality of conductive vias formed in the dielectric layer for electrically connecting the lid and the wire segment to the circuit layer.

In an embodiment, the encapsulant can have a surface flush with the second side of the lid.

The present invention further provides a method of fabricating a package structure, comprising: providing a substrate having at least a ground pad and at least an MEMS element; disposing a lid on the substrate for covering the MEMS element; electrically connecting the ground pad and the lid through at least a bonding wire; forming an encapsulant on the substrate encapsulating the lid, the bonding wire and the ground pad; removing a portion of the for encapsulant and a portion of the bonding wire so as to form a first wire segment and a second wire segment, wherein the first wire segment has one end exposed from the encapsulant and the other end connected to the ground pad, and the second wire segment has one end exposed from the encapsulant and the other end connected to the lid; and forming a circuit layer on the encapsulant and electrically connected to the first and second wire segments.

In an embodiment, the method further comprises, after forming the encapsulant, forming at least a dielectric layer on the encapsulant; and forming a circuit layer on the dielectric layer and forming a plurality of conductive vias in the dielectric layer, wherein the first and second wire segments are electrically connected to the circuit layer via the conductive vias. In an embodiment, the method further comprises forming a plurality of openings in the dielectric layer for exposing one end of each of the first and second wire segments, and the conductive vias are formed in the openings.

The present invention provides another method of fabricating a package structure, comprising: providing a substrate having at least a ground pad and at least an MEMS element; disposing a lid on the substrate for covering the MEMS element, wherein the lid has a first side and a second side opposite to the first side and is disposed on the substrate via the first side; electrically connecting the ground pad and the lid through at least a bonding wire; forming an encapsulant on the substrate for encapsulating the lid, the bonding wire and the ground pad; removing a portion of the encapsulant and a portion of the bonding wire so as to expose the second side of the lid and form a wire segment with one end exposed from the encapsulant and the other end electrically connecting the ground pad; and forming a circuit layer on the encapsulant and electrically connected to the wire segment and the lid.

In an embodiment, the method further comprises, after forming the encapsulant, forming at least a dielectric layer on the encapsulant; and forming a circuit layer on the dielectric layer and forming a plurality of conductive vias in the dielectric layer, wherein the first and second wire segments are electrically connected to the circuit layer via the conductive vias. In an embodiment, the method further comprises forming a plurality of openings in the dielectric layer for exposing a portion of the lid and one end of the wire segment such that the conductive vias are formed in the openings.

In an embodiment, the encapsulant has a surface flush with the second side of the lid.

In an embodiment, the methods further comprise performing a singulation process.

In an embodiment, the MEMS element of the package structures and methods is a gyroscope, an accelerometer or an RF (radio frequency) element, and the ground pad is positioned at an outer periphery of the lid.

In an embodiment, a metal layer is formed on the lid and electrically connected to the second wire segment or the conductive vias.

In an embodiment, the conductive pads are arranged at an equal interval and extending over the lid.

In an embodiment, an insulation layer is formed on the dielectric layer and the circuit layer, and at least an opening is formed in the insulation layer to expose a portion of the circuit layer so as for the ground conductive element to be formed thereon.

Therefore, by commonly grounding the lid and the substrate, the present invention can effectively release accumulated electric charges on the lid so as to improve the reliability of the MEMS system and reduce the number of I/O connections.

BRIEF DESCRIPTION OF DRAWINGS

FIGS. 2A to 2F are schematic cross-sectional views showing a package structure having an MEMS element and a method of fabricating the same according to a first embodiment of the present invention, wherein FIGS. 2B', 2E' and 2F' show another embodiment of FIGS. 2B, 2E and 2F, respectively.

DETAILED DESCRIPTION OF PREFERRED EMBODIMENTS

Figure 1:
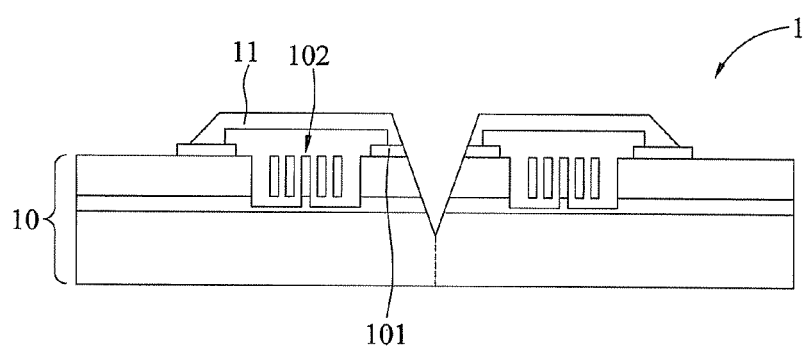
FIG. 1 is a schematic cross-sectional view showing a conventional package structure having an MEMS element.

The following illustrative embodiments are provided to illustrate the disclosure of the present invention, these and other advantages and effects can be apparent to those in the art after reading this specification.

It should be noted that all the drawings are not intended to limit the present invention. Various modification and variations can be made without departing from the spirit of the present invention. Further, terms such as "top", "bottom", "on", "a" etc. are merely for illustrative purpose and should not be construed to limit the scope of the present invention.

FIGS. 2A to 2G are schematic cross-sectional views showing a package structure having an MEMS element and a method of fabricating the same according to a first embodiment of the present invention.

Referring to FIG. 2A, a substrate 20 having a plurality of signal/power pads (not shown), a plurality of ground pads 201 and at least an MEMS element 202 is provided.

In an embodiment, the substrate 20 is, but not limited to, a wafer, and the MEMS element 202 is a gyroscope, an accelerometer or an RF element.

Referring to FIG. 2B, at least a lid 21 is disposed on the substrate 20 to cover the MEMS element 202.

In an embodiment, the lid 21 has a first side 21a and a second side 21b opposite to the first side 21a and is disposed on the substrate 20 via the first side 21a.

In an embodiment, the lid 21 is made of metal, silicon, glass or ceramic. Referring to FIG. 2B', if the lid 21 is made of silicon, glass or ceramic, rather than conductor, a metal layer 211 can be formed on the second side 21b of the lid 21 by sputtering so as to electrically connect bonding wires or conductive vias. The metal layer 211 can be made of Al, Cu, Au, Pd, Ni/Au, Ni/Pb, TiW/Au, Ti/Al, TiW/Al, Ti/Cu/Ni/Au or a combination thereof.

Referring to FIG. 2C, a wire bonding process is performed to form a plurality of bonding wires 22 for electrically connecting the ground pads 201 and the lid 21.

Then, an encapsulant 23 is formed on the substrate 20 to encapsulate the lid 21, the bonding wires 22 and the ground pads 201.

In an embodiment, the encapsulant 23 is made of, but not limited to, a thermosetting resin such as an epoxy resin, an epoxy molding compound (EMC), polyimide or silicone.

Referring to FIG. 2D, a portion of the encapsulant 23 and portions of the bonding wires 22 are removed by grinding, laser, plasma, chemical etching or chemical mechanical polishing (CMP) so as to form first wire segments 221 and second wire segments 222. The first wire segment 221 has an upper end exposed from the encapsulant 23 and a lower end connected to the corresponding ground pad 201, and the second wire segment 222 has an upper end exposed from the encapsulant 23 and a lower end connected to the lid 21.

Figure 2E:
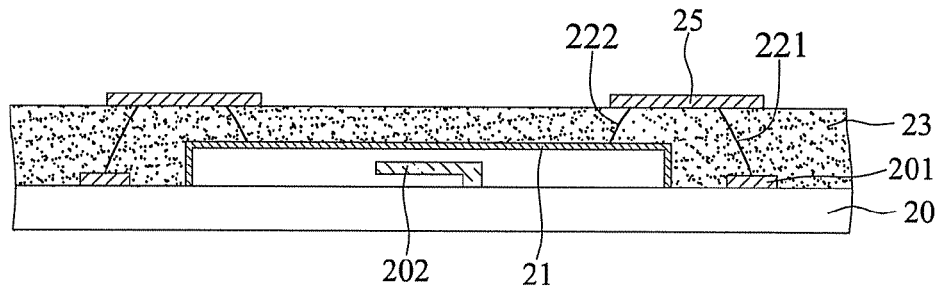
Figure 2E:
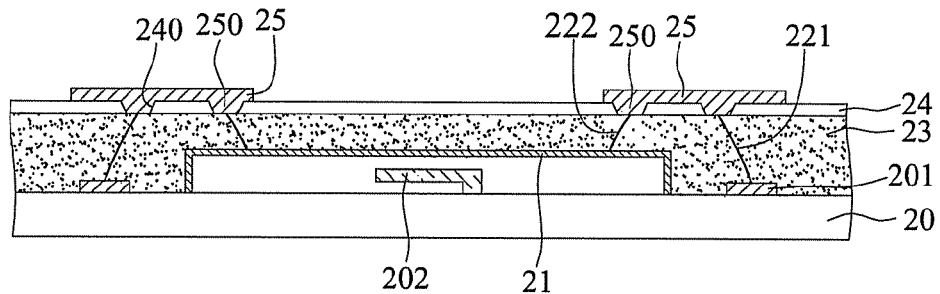

Referring to FIG. 2E, a redistribution layer (RDL) process is performed such that a circuit layer 25 is formed on the encapsulant 23 and electrically connected to the first and second wire segments 221, 222.

In another embodiment, referring to FIG. 2E', a dielectric layer 24 is formed on the encapsulant 23, and a plurality of openings 240 are formed in the dielectric layer for exposing the upper ends of the first and second wire segments 221, 222. Further, a conductive material is formed in the openings 240 so as to form a plurality of conductive vias 250. As such, the first and second wire segments 221, 222 are electrically connected to the circuit layer 25 through the conductive vias 250.

In an embodiment, the conductive vias 250 are arranged at an equal interval and extending over the lid 21.

By connecting the lid 21 and the ground pads 201 of the substrate 20 through the circuit layer 25, the lid 21 is grounded so as to prevent excessive accumulation of electric charges on the lid 21, thereby improving the reliability of the MEMS system.

Figure 2F:
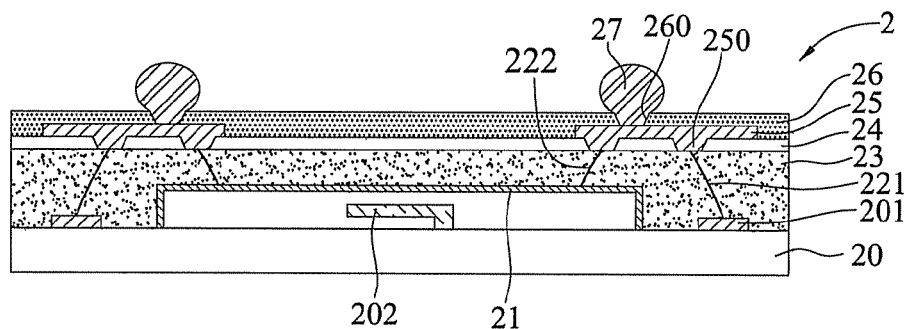
Figure 2F:
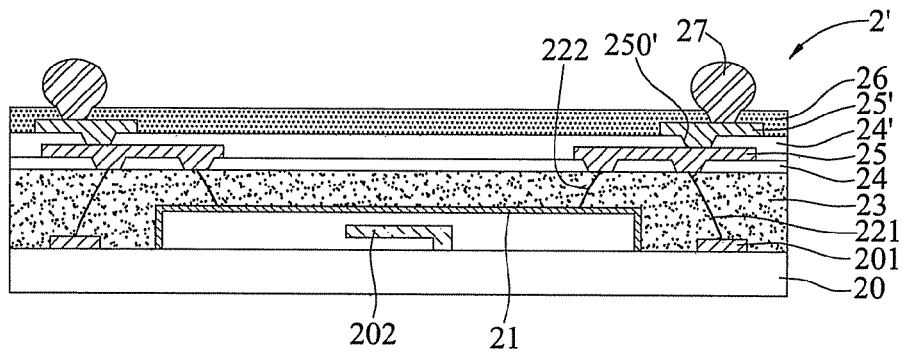

Further, referring to FIG. 2F, an insulation layer 26 is formed on the dielectric layer 24 and the circuit layer 25, and a plurality of openings 260 are formed in the insulation layer 26 such that a portion of the circuit layer 25 is exposed so as for ground conductive elements 27 such as solder balls to be formed thereon. As such, the ground conductive elements 27 are electrically connected by both of the substrate 20 and the lid 21.

Subsequently, a singulation process is performed to obtain a package structure 2 having an MEMS element 202.

In an embodiment, the ground conductive elements 27 can be made of metal or an alloy and have a soldering or welding property. Preferably, the ground conductive elements 27 are made of Sn/Pb, Sn/Ag/Cu or Au.

Further, referring to a package structure 2' of FIG. 2F', an RDL process can be performed to form multiple dielectric layers 24, 24' and multiple circuit layers 25, 25' on the encapsulant 23.

Figure 3:
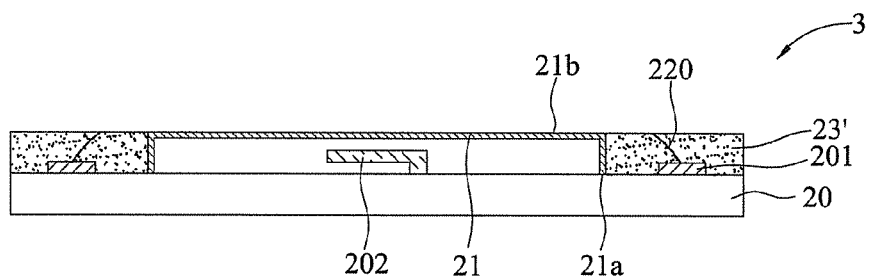
FIGS. 3 and 3' are schematic cross-sectional views showing a package structure having an MEMS element according to a second embodiment of the present invention.
Figure 3:
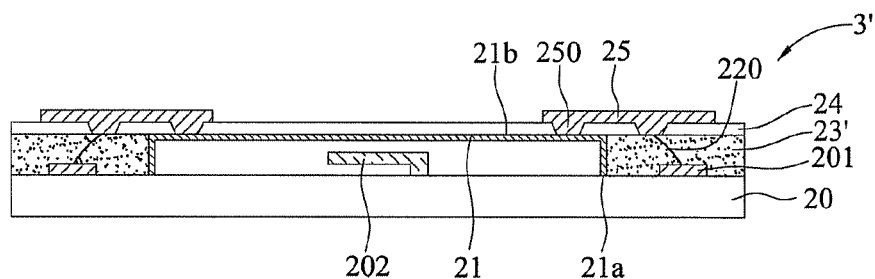

FIGS. 3 and 3' are schematic cross-sectional views showing a package structure 3, 3' having an MEMS element according to a second embodiment of the present invention. The second embodiment differs from the first embodiment in that a portion of the encapsulant 23 and a portion of the bonding wires 22 of the second embodiment are removed so as to expose the top surface of the lid 21 and form a plurality of wire segments 220 each having one end exposed from the encapsulant 23 and the other end connected to the corresponding ground pad 201. As such, the circuit layer 25 is electrically connected to the lid 21 either directly or through a plurality of conductive vias 250.

In particular, referring to FIG. 3, a portion of the encapsulant 23' and portions of the bonding wires 22 are removed to expose the second side 21b (i.e., the top surface) of the lid 21 from the encapsulant 23' such that the surface of the encapsulant 23' is flush with the second side 21b of the lid 21.

Other processes are substantially the same as those in the first embodiment and detailed description thereof is omitted herein.

The present invention provides a package structure 2, 2', which has: a substrate 20 having at least a ground pad 201 and at least an MEMS element 202; a lid 21 disposed on the substrate 20 for covering the MEMS element 202; at least a first wire segment 221 electrically connected to the ground pad 201; at least a second wire segment 222 electrically connected to the lid 21; an encapsulant 23 formed on the substrate 20 for encapsulating the lid 21 and the first and second wire segments 221, 222, with one end of each of the first and second wire segments 221, 222 exposed therefrom; a circuit layer 25, 25' formed on the encapsulant 23 and electrically connected to the first and second wire segments 221, 222; and at least a ground conductive element 27 electrically connected to the circuit layer 25, 25' so as for the substrate 20 and the lid 21 to be jointly electrically connected to the at least a ground conductive element 27 via the circuit layer 25, 25'.

In an embodiment, the ground pad 201 is positioned at an outer periphery of the lid 21, and MEMS element 202 is a gyroscope, an accelerometer or an RF element.

A metal layer 211 can be formed on the lid 21 and electrically connected to the second wire segment 222.

In an embodiment, the structure further has at least a dielectric layer 24, 24' formed between the encapsulant 23 and the circuit layer 25, 25'. A plurality of conductive vias 250, 250' are formed in the dielectric layer 24, 24' and electrically connected with the first and second wire segments 221, 222 to the circuit layer 25, 25', and the conductive vias 250, 250' can be arranged at an equal interval and extending over the lid 21.

In an embodiment, the package structure further has an insulation layer 26 formed on the dielectric layer 24, 24' and the circuit layer 25, 25', and the insulation layer 26 has at least an opening 260 that exposes a portion of the circuit layer 25, 25' so as for the ground conductive element 27 to be formed thereon.

In another package structure 3, 3', the lid 21 has a first side 21a and a second side 21b opposite to the first side 21a, and the lid 21 is disposed on the substrate 20 via the first side 21a. The surface of the encapsulant 23' is flush with the second side 21b of the lid 21. The wire segment 220 electrically connects the ground pad 201. The wire segment 220 and the lid 21 are electrically connected through the circuit layer 25 or the conductive vias 250.

According to the present invention, the lid and the substrate are electrically connected through the circuit layer so as to share a common ground conductive element. Therefore, the present invention avoids excessive accumulation of electric charges on the lid to thereby improve the reliability of the MEMS system and reduce the number of I/O connections.

The above-described descriptions of the detailed embodiments are intended to illustrate the preferred implementation according to the present invention but are not intended to limit the scope of the present invention. Accordingly, all modifications and variations completed by those with ordinary skill in the art should fall within the scope of present invention defined by the appended claims.

What is claimed is:

1. A package structure, comprising:
   a substrate having at least a ground pad and at least a micro-electro-mechanical system (MEMS) element;
   a lid disposed on the substrate for covering the MEMS element;
   at least a first wire segment electrically connected to the ground pad;
   at least a second wire segment electrically connected to the lid;
   an encapsulant formed on the substrate for encapsulating the lid and the first and second wire segments, in a manner that an end of each of the first and second wire segments is exposed from the encapsulant;
   a circuit layer formed on the encapsulant and electrically connected to the first and second wire segments; and
   at least a ground conductive element electrically connected to the circuit layer so as for the substrate and the lid to be electrically connected to at least a ground conductive element via the circuit layer.

2. The package structure of claim 1, wherein the MEMS element is a gyroscope, an accelerometer or an RF (radio frequency) element.

3. The package structure of claim 1, wherein the ground pad is positioned at an outer periphery of the lid.

4. The package structure of claim 1, further comprising a metal layer formed on the lid and electrically connected to the second wire segment.

5. The package structure of claim 1, further comprising:
   at least a dielectric layer formed between the encapsulant and the circuit layer; and
   a plurality of conductive vias formed in the dielectric layer and electrically connecting the first and second wire segments to the circuit layer.

6. The package structure of claim 5, wherein the conductive vias are arranged at an equal interval.

7. The package structure of claim 5, further comprising an insulation layer formed on the dielectric layer and the circuit layer.

8. The package structure of claim 7, wherein the insulation layer has at least an opening that exposes a portion of the circuit layer, and the ground conductive element is disposed on the exposed portion of the circuit layer.

9. A package structure, comprising:
   a substrate having at least a ground pad and at least an MEMS element;
   a lid having a first side and a second side opposite to the first side, the lid being disposed on the substrate via the first side for covering the MEMS element;
   at least a wire segment electrically connected to the ground pad;
   an encapsulant formed on the substrate and encapsulating the lid and the wire segment, and the second side of the lid and one end of the wire segment exposed from the encapsulant;
   a circuit layer formed on the encapsulant and electrically connected to the lid and the wire segment; and at least a ground conductive element electrically connected to the circuit layer so as for the substrate and the lid to be electrically connected to at least a ground conductive element via the circuit layer.

10. The package structure of claim 9, wherein the MEMS element is a gyroscope, an accelerometer or an RF element.

11. The package structure of claim 9, wherein the ground pad is positioned at an outer periphery of the lid.

12. The package structure of claim 9, further comprising:
at least a dielectric layer formed between the encapsulant and the circuit layer; and
a plurality of conductive vias formed in the dielectric layer for electrically connecting the lid and the wire segment to the circuit layer.

13. The package structure of claim 12, further comprising a metal layer formed on the lid and electrically connected to the conductive vias.

14. The package structure of claim 12, wherein the conductive vias are arranged at an equal interval.

15. The package structure of claim 12, further comprising an insulation layer formed on the dielectric layer and the circuit layer.

16. The package structure of claim 15, wherein the insulation layer has at least an opening that exposes a portion of the circuit layer, and the ground conductive element is formed on the exposed portion of the circuit layer.

17. The package structure of claim 9, wherein the encapsulant has a surface flush with the second side of the lid.

18. A method, comprising:
providing a substrate having at least a ground pad and at least an MEMS element;
disposing a lid on the substrate for covering the MEMS element;
electrically connecting the ground pad and the lid through at least a bonding wire;
forming an encapsulant on the substrate encapsulating the lid, the bonding wire and the ground pad;
removing a portion of the encapsulant and a portion of the bonding wire to form a first wire segment and a second wire segment, wherein the first wire segment has one end exposed from the encapsulant and the other end connected to the ground pad, and the second wire segment has one end exposed from the encapsulant and the other end connected to the lid; and
forming a circuit layer on the encapsulant for being electrically connected to the first and second wire segments.

19. The method of claim 18, wherein the MEMS element is a gyroscope, an accelerometer or an RF element.

20. The method of claim 18, wherein the ground pad is positioned at an outer periphery of the lid.

21. The method of claim 18, further comprising forming a metal layer on the lid.

22. The method of claim 18, after forming the encapsulant, further comprising:
forming at least a dielectric layer on the encapsulant; and
forming a circuit layer on the dielectric layer and forming a plurality of conductive vias in the dielectric layer, wherein the first and second wire segments are electrically connected to the circuit layer by the conductive vias.

23. The method of claim 22, wherein the conductive vias are arranged at an equal interval.

24. The method of claim 22, further comprising forming a plurality of openings in the dielectric layer for exposing the one end of each of the first and second wire segments, wherein the conductive vias are formed in the openings.

25. The method of claim 22, further comprising forming an insulation layer on the dielectric layer and the circuit layer.

26. The method of claim 25, further comprising forming at least an opening in the insulation layer for exposing a portion of the circuit layer, wherein a ground conductive element is formed on the exposed portion of the circuit layer.

27. The method of claim 22, further comprising performing a singulation process.

28. A method, comprising:
providing a substrate having at least a ground pad and at least an MEMS element;
disposing a lid on the substrate for covering the MEMS element, wherein the lid has a first side and a second side opposite to the first side and the lid is disposed on the substrate via the first side;
electrically connecting the ground pad and the lid through at least a bonding wire;
forming an encapsulant on the substrate for encapsulating the lid, the bonding wire and the ground pad;
removing a portion of the encapsulant and a portion of the bonding wire to expose the second side of the lid and form a wire segment with one end exposed from the encapsulant and the other end connected to the ground pad; and
forming a circuit layer on the encapsulant for being electrically connected to the wire segment and the lid.

29. The method of claim 28, wherein the MEMS element is a gyroscope, an accelerometer or an RF element.

30. The method of claim 28, wherein the ground pad is positioned at an outer periphery of the lid.

31. The method of claim 28, further comprising forming a metal layer on the lid.

32. The method of claim 28, further comprising forming at least a dielectric layer on the encapsulant; and
forming a circuit layer on the dielectric layer and forming a plurality of conductive vias in the dielectric layer, wherein the wire segment is electrically connected to the circuit layer via the conductive vias.

33. The method of claim 32, wherein the conductive vias are arranged at an equal interval.

34. The structure of claim 32, further comprising forming a plurality of openings in the dielectric layer for exposing a portion of the lid and one end of the wire segment, wherein the conductive vias are formed in the openings.

35. The method of claim 32, further comprising forming an insulation layer on the dielectric layer and the circuit layer.

36. The method of claim 35, further comprising forming at least an opening in the insulation layer for exposing a portion of the circuit layer, wherein at least a ground conductive element is formed on the exposed portion of the circuit layer.

37. The method of claim 32, further comprising performing a singulation process.

38. The method of claim 28, wherein the encapsulant has a surface flush with the second side of the lid.

* * * * *